(12) United States Patent
Ujazdowski et al.

(10) Patent No.: US 6,414,979 B2
(45) Date of Patent: Jul. 2, 2002

(54) GAS DISCHARGE LASER WITH BLADE-DIELECTRIC ELECTRODE

(75) Inventors: Richard C. Ujazdowski, San Diego; Michael C. Cates, Escondido; Richard G. Morton, San Diego; Jean-Marc Hueber, La Jolla; Ross H. Winnick, San Diego, all of CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/768,753

(22) Filed: Jan. 23, 2001

Related U.S. Application Data

(63) Continuation-in-part of application No. 09/590,961, filed on Jun. 9, 2000.

(51) Int. Cl.[7] .......................... H01S 3/097; H01S 3/22; H01S 3/223
(52) U.S. Cl. .............................. 372/87; 372/58; 372/57
(58) Field of Search .............................. 372/55, 57, 58, 372/59, 61, 87

(56) References Cited

U.S. PATENT DOCUMENTS

| | | | |
|---|---|---|---|
| 4,247,829 A | 1/1981 | Yagi et al. ................. | 331/94.5 |
| 4,251,781 A | 2/1981 | Sutter, Jr. ................. | 331/94.5 |
| 4,414,488 A | 11/1983 | Hoffmann et al. ............ | 315/39 |
| 4,546,482 A | 10/1985 | Bagaglia et al. .............. | 372/86 |
| 4,686,682 A | 8/1987 | Haruta et al. ................. | 372/87 |
| 4,703,490 A | 10/1987 | Brumme et al. .............. | 372/86 |
| 4,742,527 A * | 5/1988 | Wiedemann et al. ......... | 372/87 |
| 4,774,714 A | 9/1988 | Javan ......................... | 372/109 |
| 4,876,693 A | 10/1989 | Lucero et al. ................ | 372/82 |
| 4,953,174 A * | 8/1990 | Eldridge et al. .............. | 372/87 |
| 4,959,840 A | 9/1990 | Akins et al. .................. | 372/57 |
| 5,070,513 A | 12/1991 | Letardi ........................ | 372/83 |
| 5,247,534 A * | 9/1993 | Muller-Horsche ............ | 372/58 |
| 5,535,233 A | 7/1996 | Mizoguchi et al. ........... | 372/87 |
| 5,557,629 A | 9/1996 | Mizoguchi et al. ........... | 372/87 |
| 5,729,565 A * | 3/1998 | Meller et al. ................. | 372/87 |
| 5,771,258 A | 6/1998 | Morton et al. ................ | 372/57 |
| 5,875,207 A * | 2/1999 | Osmanow .................... | 372/86 |

FOREIGN PATENT DOCUMENTS

JP 2631607 7/1997 ..................... 3/38

* cited by examiner

Primary Examiner—Paul Ip
Assistant Examiner—Davienne Monbleau
(74) Attorney, Agent, or Firm—John R. Ross

(57) ABSTRACT

A gas discharge laser having a laser chamber with two elongated erodable electrode elements, at least one of said electrode element having a generally blunt blade-shaped portion comprised of a material having high electrical conductivity with a flow shaping dielectric fairing positioned on each of two sides of said blunt blade-shaped portion. A pulse power system provides electrical pulses at rates of at least 1 KHz. A blower circulates laser gas between the electrodes at speeds of at least 10 m/s and a heat exchanger is provided to remove heat produced by the blower and the discharges.

17 Claims, 20 Drawing Sheets

GAS DISCHARGE LASER WITH BLADE-DIELECTRIC ELECTRODE

This application is a continuation-in-part application of Ser. No. 09/590,961, filed Jun. 9, 2000, which application is incorporated by reference herein. This invention relates to electric discharge lasers and in particular to such lasers having chambers with long life electrodes.

BACKGROUND OF THE INVENTION

The principal components of a prior art KrF excimer laser chambers are shown in FIG. 1. This chamber is a part of a laser system used as a light source for integrated circuit lithography. These components include a chamber housing 2. The housing contains two electrodes 84 and 83 each about 70 cm long and spaced apart by about 20 mm, a blower 4 for circulating a laser gas between the electrodes at velocities fast enough to clear (from a discharge region between the two electrodes) debris from one pulse prior to the next succeeding pulse at a pulse repetition rate in the range of 1000 Hz or greater, and a water cooled finned heat exchanger 6 for removing heat added to the laser gas by the fan and by electric discharges between the electrodes. The chamber may also include baffles and vanes for improving the aerodynamic geometry of the chamber. The laser gas is comprised of a mixture of about 0.1 percent fluorine, about 1.0 percent krypton and the rest neon. Each pulse is produced by applying a very high voltage potential across the electrodes with a pulse power supply 8 which causes a discharge between the electrodes lasting about 30 nanoseconds to produce a gain region about 20 mm high, 3 mm wide and 700 mm long. The discharge deposits about 2.5 J of energy into the gain region. As shown in FIG. 2, lasing is produced in a resonant cavity, defined by an output coupler 2A and a grating based line narrowing unit (called a line narrowing package or LNP, shown disproportionately large) 2B comprising a three prism beam expander, a tuning mirror and a grating disposed in a Littrow configuration. The energy of the output pulse 3 in this prior art KrF lithography laser is typically about 10 mJ. There are many industrial applications of electric discharge lasers. One important use is as the light source for integrated circuit lithography machines. One such laser light source is the line narrowed KrF laser described above which produces a narrow band pulsed ultraviolet light beam at about 248 nm. These lasers typically operate in bursts of pulses at pulse rates of about 1000 to 4000 Hz. Each burst consists of a number of pulses, for example, about 80 pulses, one burst illuminating a single die section on a wafer with the bursts separated by down times of a fraction of a second while the lithography machine shifts the illumination between die sections. There is another down time of a few seconds when a new wafer is loaded. Therefore, in production, for example, a 2000 Hz, KrF excimer laser may operate at a duty factor of about 30 percent. The operation is 24 hours per day, seven days per week, 52 weeks per year. A laser operating at 2000 Hz "around the clock" at a 30 percent duty factor will accumulate more than 1.5 billion pulses per month. Any disruption of production can be extremely expensive. For these reasons, prior art excimer lasers designed for the lithography industry are modular so that maintenance down time is minimized.

Maintaining high quality of the laser beam produced by these lasers is very important because the lithography systems in which these laser light sources are used are currently required to produce integrated circuits with features smaller than 0.25 microns and feature sizes get smaller each year. Laser beam specifications limit the variation in individual pulse energy, the variation of the integrated energy of series of pulses, the variation of the laser wavelength and the magnitude of the bandwidth of the laser beam.

Typical operation of electric discharge lasers such as that depicted in FIG. 1 causes electrode erosion. Erosion of these electrodes affects the shape of the discharge which in turn affects the quality of the output beam as well as the laser efficiency. Electrode designs have been proposed which are intended to minimize the effects of erosion by providing on the electrode a protruding part having the same width as the discharge. Some examples are described in Japanese Patent No. 2631607. These designs, however, produce adverse effects on gas flow. In these gas discharge lasers, it is very important that virtually all effects of each pulse be blown out of the discharge region prior to the next pulse.

What is needed is a gas discharge laser having erodable electrodes which do not adversely affect gas flow and can withstand many billions of pulses without adversely affecting laser beam quality.

SUMMARY OF THE INVENTION

The present invention provides a gas discharge laser having a laser chamber with two elongated erodable electrode elements, at least one of said electrode element having a generally blunt blade-shaped portion comprised of a material having high electrical conductivity with a flow shaping dielectric fairing positioned on each of two sides of said blunt blade-shaped portion. A pulse power system provides electrical pulses at rates of at least 1 KHz. A blower circulates laser gas between the electrodes at speeds of at least 10 m/s and a heat exchanger is provided to remove heat produced by the blower and the discharges.

DETAILED DESCRIPTION OF PREFERRED EMBODIMENTS

Pulse Power Supply System

Figure 3:
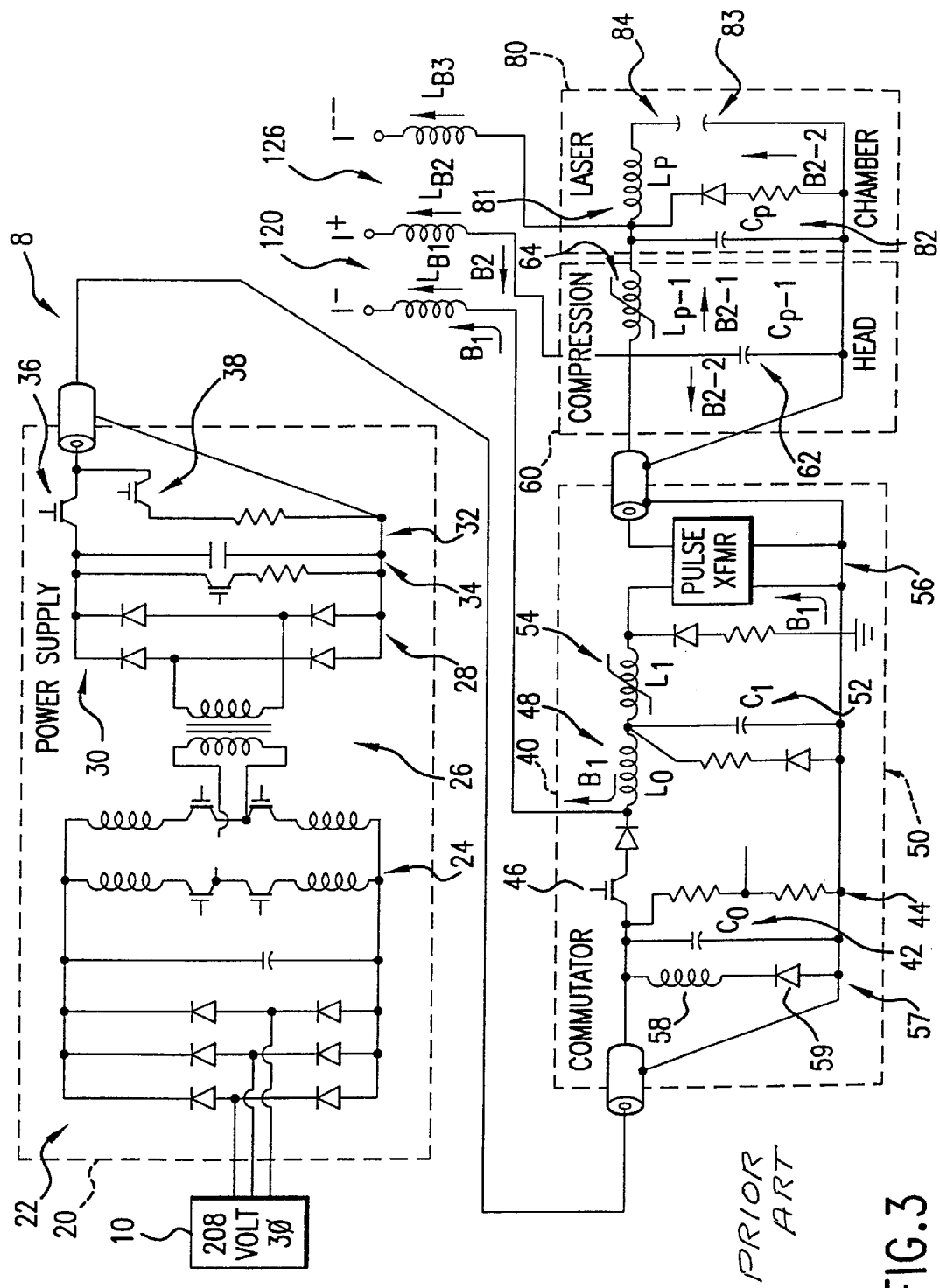
FIG. 3 shows the principal features of a pulse power system of a prior-art gas discharge laser.

The principal components of an electrical circuit 8 for providing pulse power to produce electrical discharges in a gas discharge laser are shown in FIG. 3. The pulse power system operates from a standard 208-volt, 3 phase electrical source. A power supply using rectifier 22, inverter 24, transformer 26 and rectifier 30 charges 8.1 micro-Farad charging capacitor $C_0$ 42 to a voltage level between about 500 to 1200 volts as directed by a laser control processor (not shown). The laser control processor directs the closing of an IGBT switch 46 when a pulse is desired which causes the energy on $C_0$ to be discharged into the follow-on portions of the pulse power system. The charge on $C_0$ is transferred successively to capacitor bank $C_1$ 52 through inductor 48 then through saturable inductor 54 and through voltage transformer 56 to capacitor bank $C_{p-1}$ 62 and then through saturable inductor 64 to peaking capacitor bank $C_p$ 82. As shown in FIG. 3, peaking capacitor bank $C_p$ is connected electrically in parallel with electrodes 84 and 83.

Figure 4A:
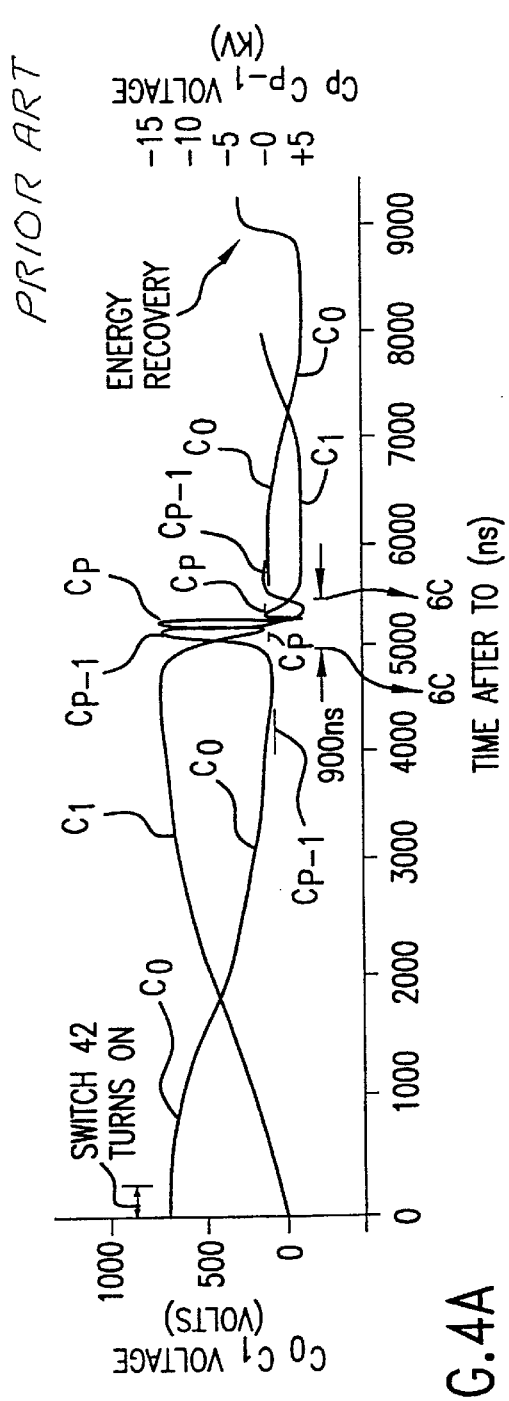
FIGS. 4A and 4B show electrical pulse shapes on the FIG. 3 pulse power system.
Figure 4B:
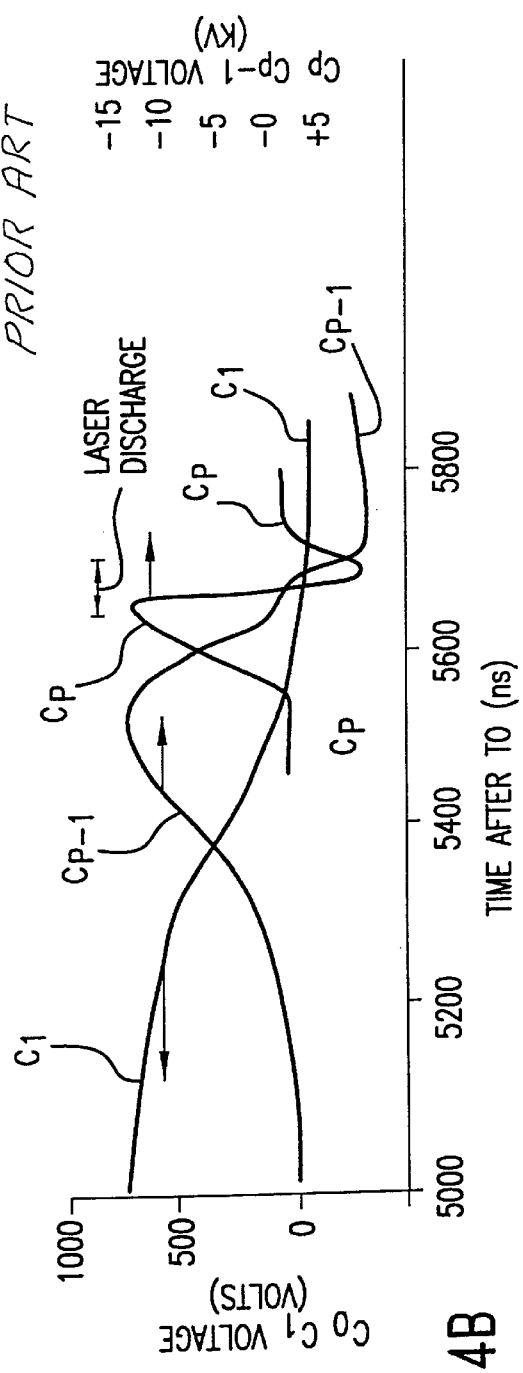

FIG. 4A shows the potential on capacitor banks $C_0$, $C_1$, $C_{p-1}$ and $C_p$ as a function of time beginning with the closing of switch 42 and for the following 9 microseconds. FIG. 4B shows an 800 ns time slice just before and after the discharge. The reader should note that the peaking capacitor bank $C_p$ is charged to approximately −15,000 V just prior to the discharge. The discharge lasts about 30 ns. During the discharge, the electron flow is first from the upper electrode, cathode 84 to the lower grounded electrode, anode 83. A current "overshoot" charges $C_p$ to a positive value of about +6,000 V at which time the downward flow of electrons is reversed after which the electron flow is from the lower grounded electrode to the upper electrode during the last approximately 15 ns of the discharge, all as shown in FIG. 4B.

Erosion

Applicants have discovered that electrode erosion occurs on both electrodes but that the erosion rate of the grounded electrode (anode 83) is about four times that of the high voltage electrode (cathode 84). Also, operation normally results in an insulating layer of metal fluorides being built up very gradually on portions of the anode. In some cases near the end of life of the electrodes, the portion of the discharge surface covered by the layer can be between 50% and 80% or more. In the regions covered by the fluoride layer discharge current flows through tiny holes which typically tend to have approximately circular cross sections with diameters of about 50 to 100 microns. The surfaces covered by the fluoride layer do not suffer substantial further erosion but the erosion rate is increased on the non-covered discharge surfaces as the non-covered surface area decreases. (There appears to be some erosion on the covered surfaces at the locations of the tiny holes.) Electrode erosion and fluoride build up in prior art lasers typically becomes so severe that at about 5 to 10 billion pulses, the laser beam no longer meets quality specifications. At this time typically the laser chamber is replaced with a chamber with new electrodes. A replacement chamber costs several thousand dollars and replacement requires a temporary shutdown of integrated circuit production.

Most electric discharge lasers used for integrated circuit lithography utilize brass such as C36000 brass (61.5% copper, 35.5% zinc and 3% lead) as the electrode material. Many other materials have been tested in efforts to discover better electrode material, but to the best of Applicant's knowledge none have been proven to be better than brass taking into consideration all costs including cost of laser manufacture and cost of operation. However, recent tests by Applicants' indicate that a high strength copper material containing submicron clumps of $Al_2O_3$ sold under the trademark GLIDCOP® and available from OMG Americas with offices in Research Triangle Park, NC is a good electrode material. More recent tests by Applicant indicated that alloys of copper, aluminum and iron or copper, zinc and iron and alloys copper and iron with trace amounts of zinc and phosphorous could provide improved performance. These tests also indicate that annealing the electrode material after machining also improves performance. Good alloys appear to be C95400 (85% Cu, 11% Al and 4% Fe) for both anode and cathode and C19400 (97.5% Cu, 2.35% Fe, 12% Zn and 0.03% Ph) for the cathode. One of the Applicants has discovered that copper alloys known as spinodal copper alloys perform very well as electrode material in a fluorine environment. Many excellent electrode materials are not compatible with the extremely reactive fluorine gas in these chambers.

Sputtered Metal Ions—Important Part of Discharge

In order to create a good laser active media, a uniform discharge plasma must be created between the electrodes. Initially the gas in the gap between the electrodes is preionized with preionizer 12 shown in FIG. 1. As the voltage builds up on the electrodes a substantial portion of the plasma, in the regions close to the cathode is produced by ion sputtering of the electrode material. Metal atoms sputtered from the electrodes are mostly in vapor form and a substantial portion of the metal atoms are ionized and help form a positive ion cathode "fall" region immediately adjacent to the surface of the cathode creating an extremely large electric field which may contribute to the flow of electrons from the cathode and also accelerates electrons leaving the cathode. This process applies first to cathode 84 during the first portion of each pulse. However, because the polarity of the electrodes switch about half-way through the pulse, as shown in FIG. 4B, this effect also occurs at anode 83 which at that time functions as a cathode (i.e., the negative electrode). Both during and after the pulse the metal ions may be attracted back to the electrodes depending on the rapidly changing electric field conditions, but many combine with fluorine and/or are blown away by the circulating laser gas. Applicants have estimated the erosion loss at the anode at about 3 grams per billion pulses or about $3 \times 10^{-9}$ grams per pulse which corresponds to about $2.8 \times 10^{13}$ atoms per pulse. Since there are about 1500 $mm^2$ of discharge surface on the anode, the loss is about $1.2 \times 10^{10}$ atoms per $mm^2$ per pulse. Since each atomic layer of the brass electrodes contains about $3 \times 10^{13}$ atoms per $mm^2$, an atomic layer is lost from the anode with about 2,500 pulses (a little more than one second at a 2,000 Hz pulse rate). After 10 billion pulses about 4.4 million atomic layers are lost corresponding to a reduction of about 0.5 mm in the vertical position of the discharge surface of the electrode. In prior art electrodes of the type shown in FIG. 1, this reduction is accompanied by a widening of the discharge region on the surface of the electrodes, especially the anode, and a widening, displacement or splitting of the discharge, and a buildup of fluoride layers on portions of the anode discharge surface. This normally has a substantial adverse effect on the quality of the laser beam produced by the laser.

Issues

There are five important issues to deal with in developing a better electrode for electric discharge lithography lasers using fluorine containing laser gas:

1) electrode erosion seriously affects beam quality,
2) electrode erosion currently limits laser chamber life, 3) anode erosion is about four times cathode erosion,
4) fluoride layer buildup on the anode is a problem, and
5) maintaining good gas flow conditions in the discharge gap is very important.

The various embodiments of the present invention described herein deal with these issues. The electrodes satisfy the following criteria:

1) the electrodes comprise an erosion surface which erodes very slowly over several billion laser pulses with the erosion not substantially affecting beam quality,
2) the erosion surfaces resists fluoride insulation buildup on discharge regions, and
3) the electrodes are designed to provide improved gas flow to permit repetition rates of 1,000 Hz to 6,000 Hz or greater without substantial turbulence in the discharge region.

Anode Assembly

Figure 5:
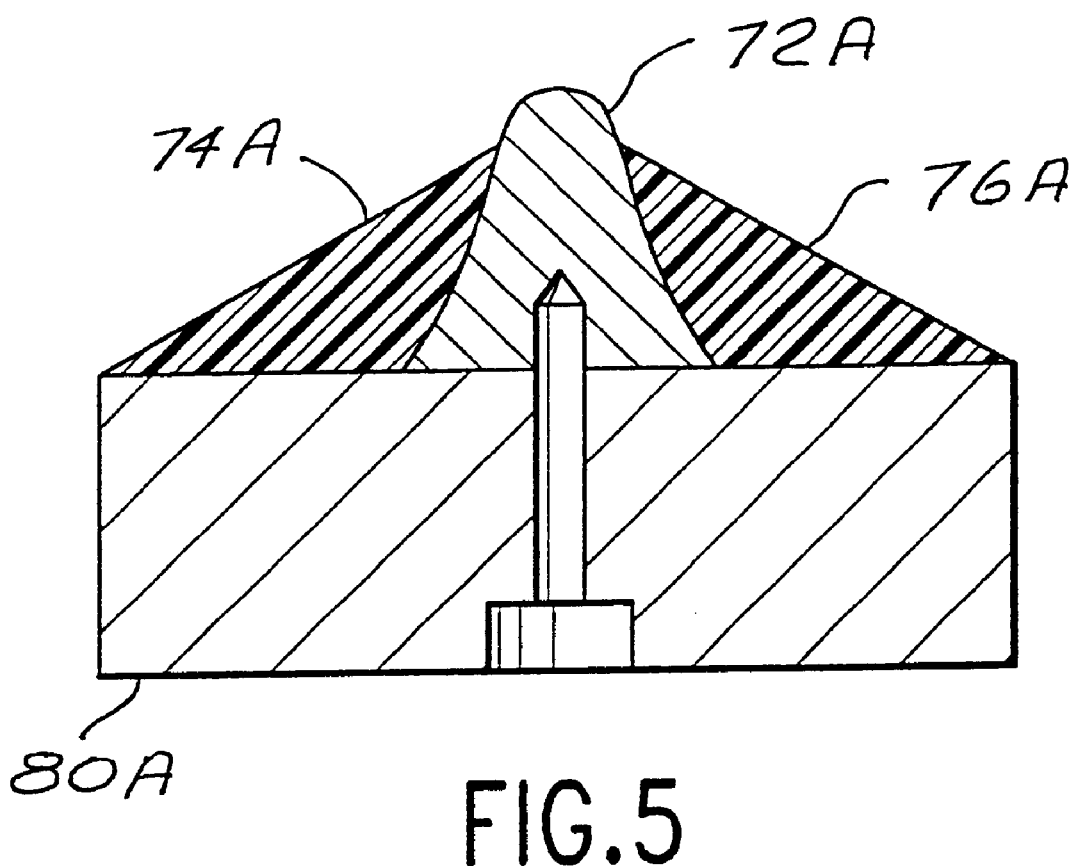
FIG. 5 show features of an anode assembly disclosed in Ser. No. 09/590,961.

FIG. 5 shows the cross section of an anode assembly disclosed in Ser. No. 09/590,961 which is the parent of this application. Erodable electrode 72A and dielectric flow spacers 74A and 76A are mounted on anode support bar 80A.

Electrode System Description

General Description

Figure 6:
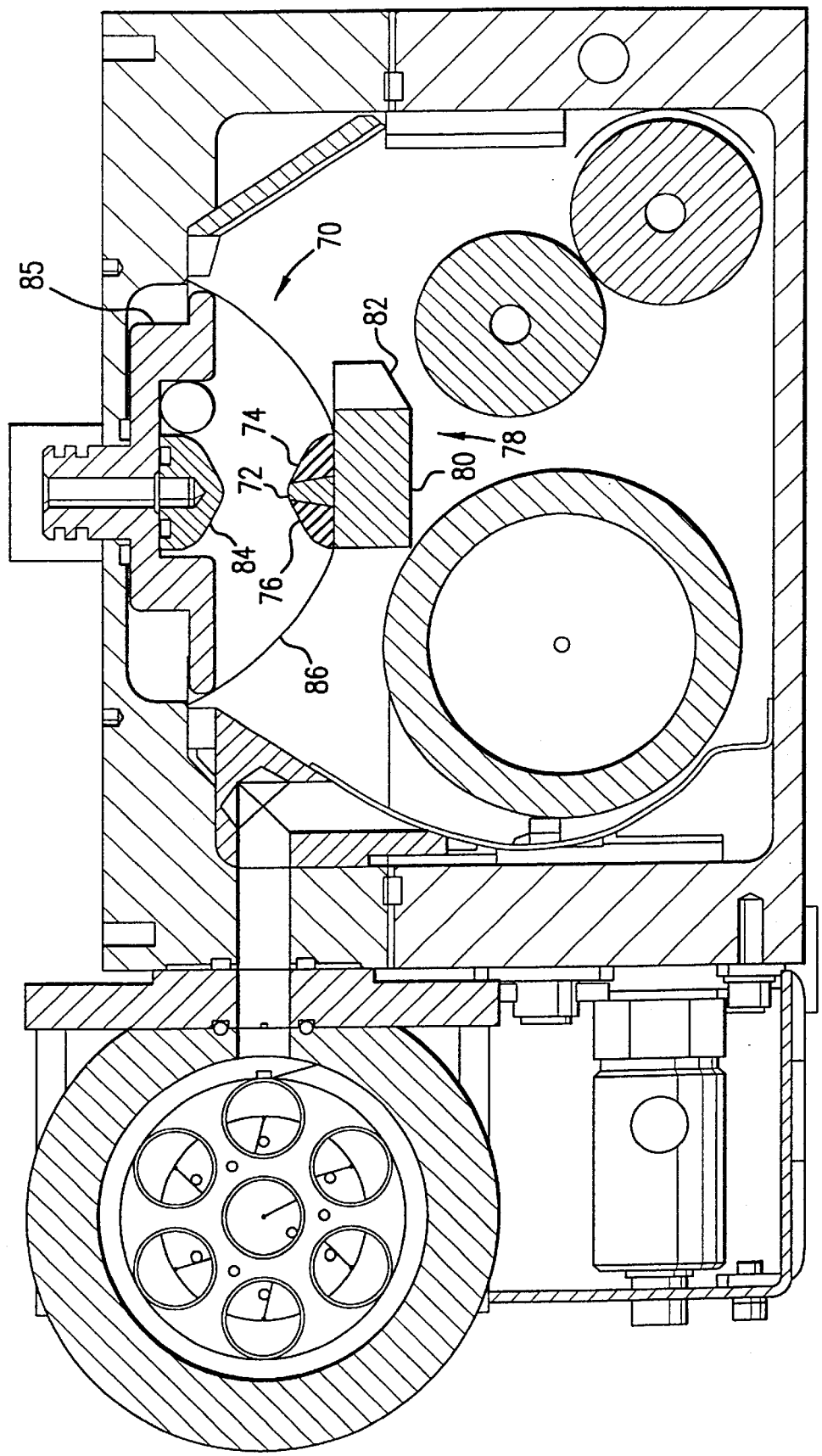
FIG. 6 is a cross section drawing of a laser chamber showing a preferred embodiment of the present invention.

FIG. 6 is a cross section of a laser chamber drawing showing an actual implementation of the present invention built and tested by Applicants. In this chamber, a novel electrode system is provided which has provided substantially improved lifetime performance as compared with the prior art electrode system described above with reference to FIG. 1. The important new elements in this electrode system is anode assembly 70 comprised of blade electrode 72, dielectric fairings 74 and 76, anode support bar 78 (comprising base 80 and cooling fins 82), pointed cathode 84 and current return unit 86.

Blunt Blade-Shaped Anode

Figure 7A:
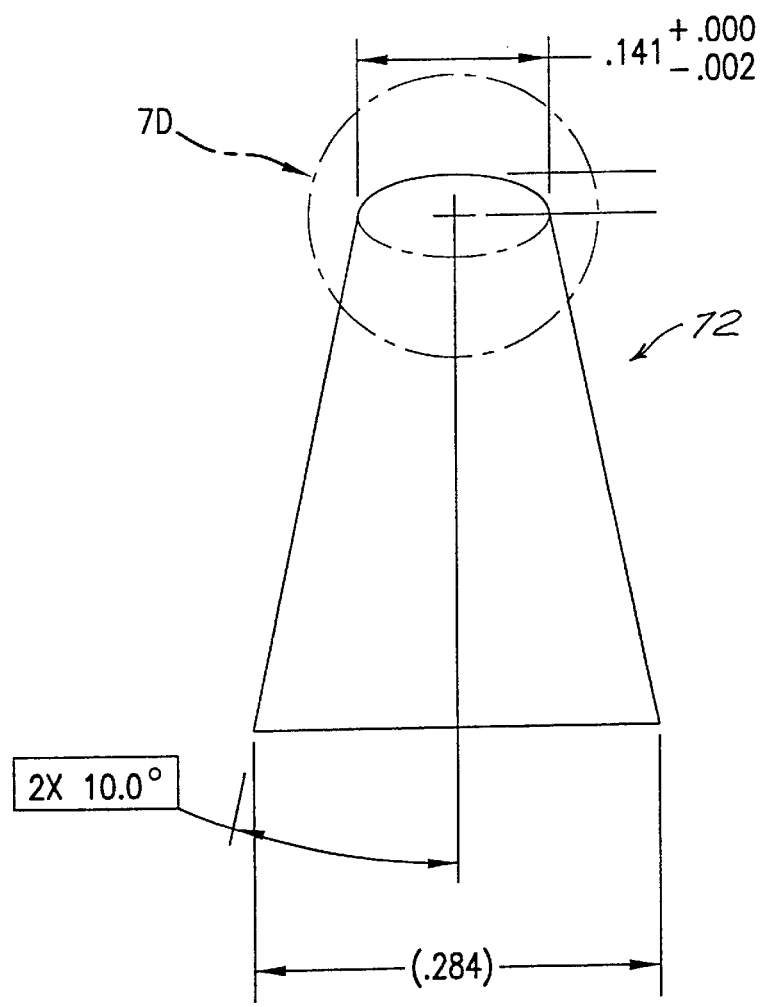
FIGS. 7A–D show views of a preferred blunt blade-shaped anode.
Figure 7B:
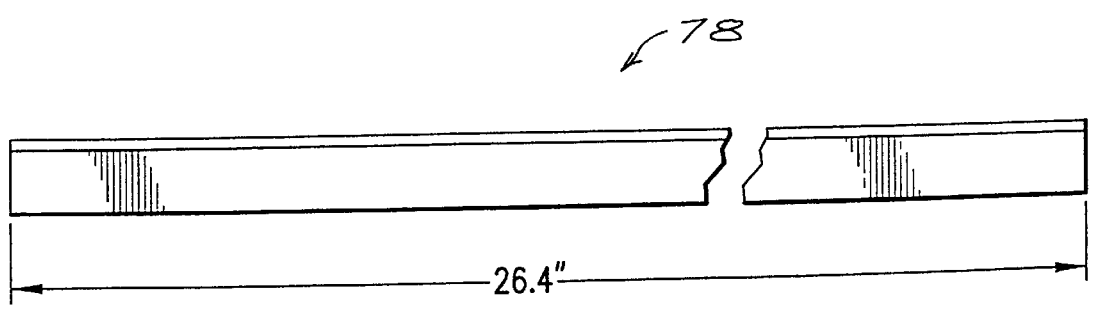
Figure 7C:
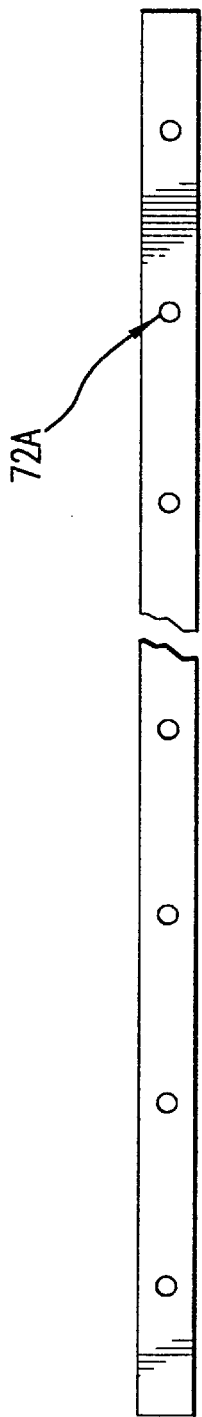
Figure 7D:
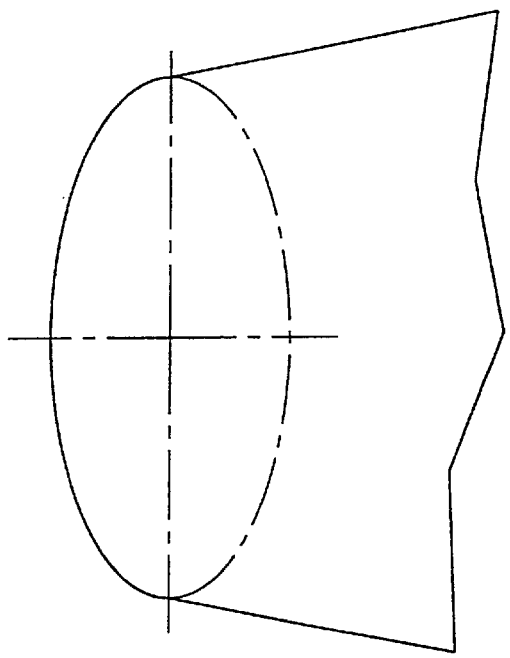

The anode 72 in this preferred embodiment is described in FIGS. 7A, 7B, 7C and 7D. The anode is 26.4 inches long and 0.439 inch high. It is 0.284 inch wide at the bottom and 0.141 inch wide at the top. FIG. 7A is a cross section view. FIG. 7B is a side view and FIG. 7C is a bottom view. FIG. 7D shows a preferred cross section shape of the top of the electrode. The cross section shape is chopped-off isosceles triangle with 10 degree-sloping side and an elliptical top as shown in FIG. 7A. The cross section shape is also similar to that of a blunt ax blade. The bottom of the anode is provided with 26 equally spaced tapped screw holes 72A for attaching the anode to the anode support bar 78.

Preferably the anode material is a copper based alloy suitable for electrode use in a fluorine environment. Preferred choices include C36000, C95400 or C19400. Applicants' tests indicates that annealing the electrode after machining improves performance substantially. Another preferred anode material is spinodal copper alloys such as alloys Nicomet® 3 available from Anchor Bronze and Metals with offices in Bay Village, Ohio. This material is comprised of about 80 percent copper, about 7 percent tin and about 12½ percent nickel and is made using a process known as spinodal decomposition.

Dielectric Fairings

Figure 8A:
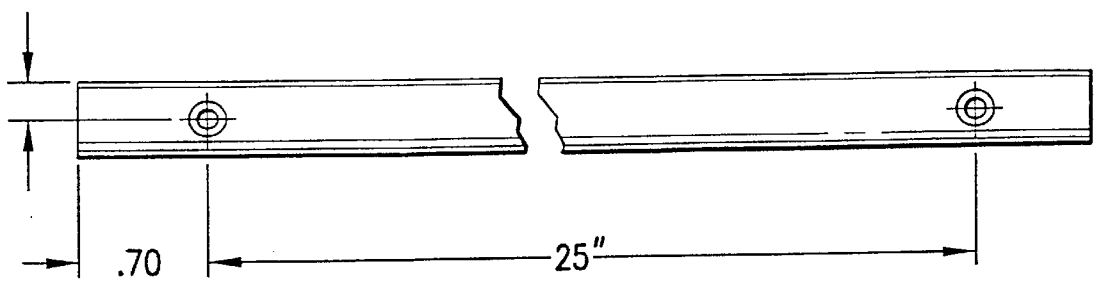
FIGS. 8A–D show views of a preferred dielectric fairings.
Figure 8B:
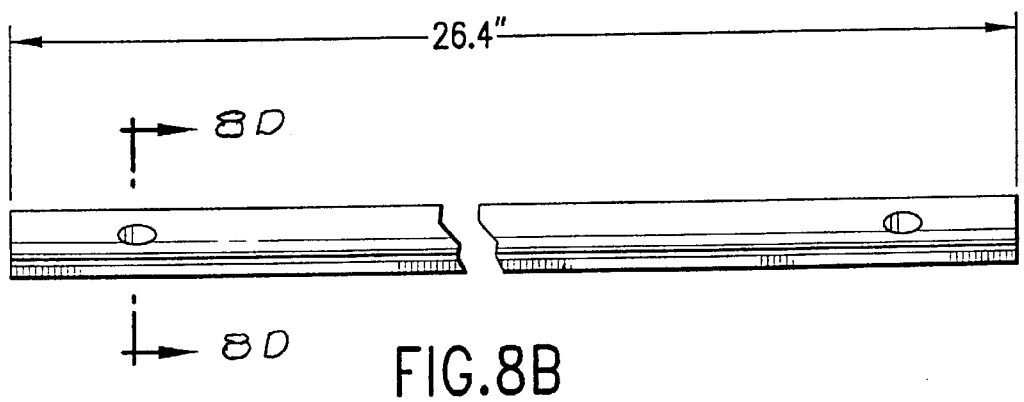
Figure 8C:
Figure 8D:
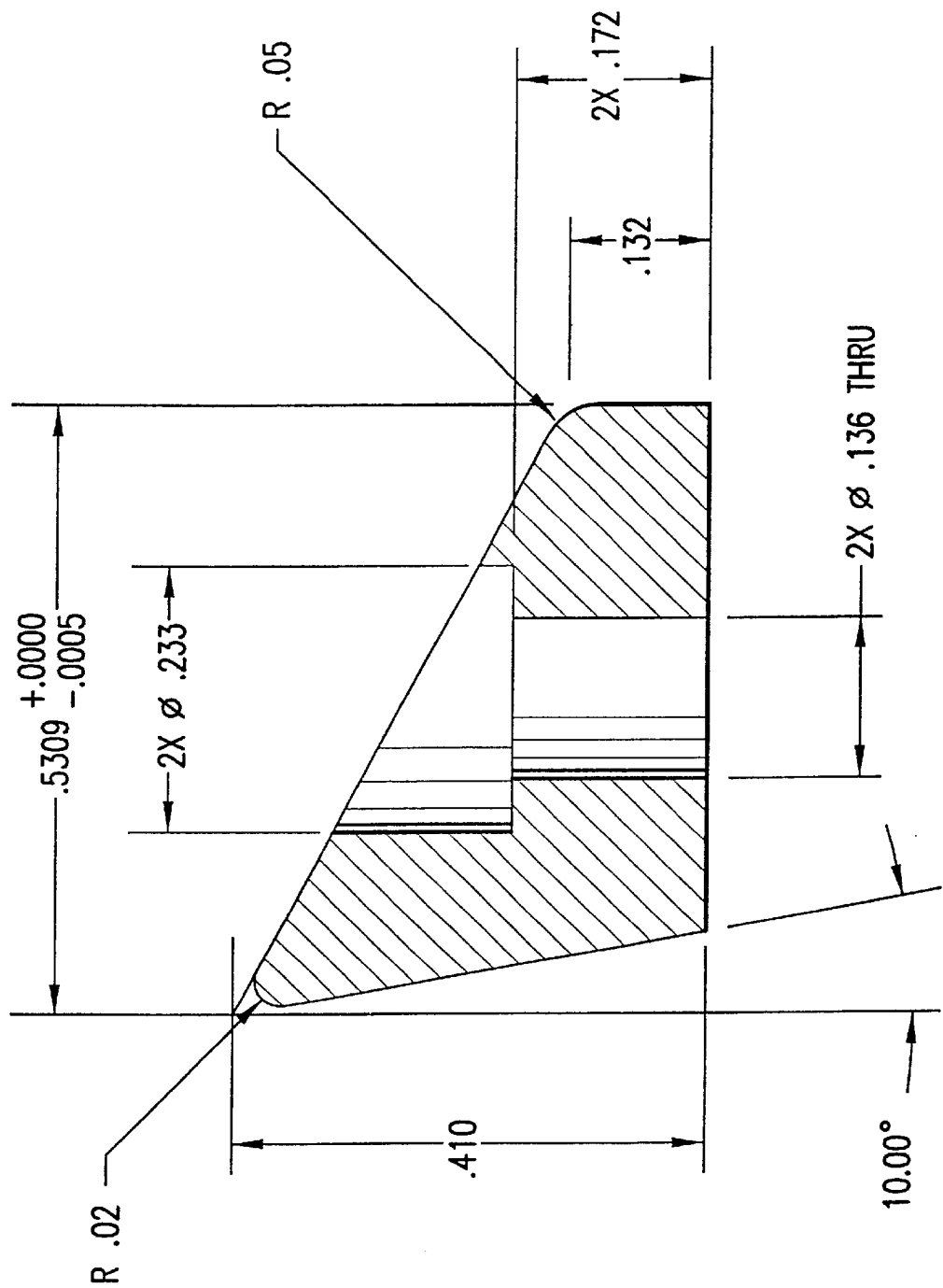

Fairings are described in FIGS. 8A, 8B, 8C and 8D. Each fairing is 26.4 inches long, 0.410 inch high at its highest part and 0.5309 inch wide all as shown in the figures. FIG. 8A is a top view, FIG. 8B is a side view and FIG. 8C is a bottom view. FIG. 8D is a cross section drawing at section 8D as shown in FIG. 8B. Fairings 74 and 76 are held in place with screws 88 which fit through holes as shown in FIGS. 8A and 8D at both ends of anode 72. The screws fit loosely through fairings 74 and 76 and are secured into anode support bar 78. This allows for expansion and contraction of fairings 74 and 76 relative to anode support bar 78. Fairings 74 and 76 and dowel pins 88 are all preferably comprised of ceramic high density alumina with a density of 99.5 percent or greater.

Anode Support Bar

Figure 9A:
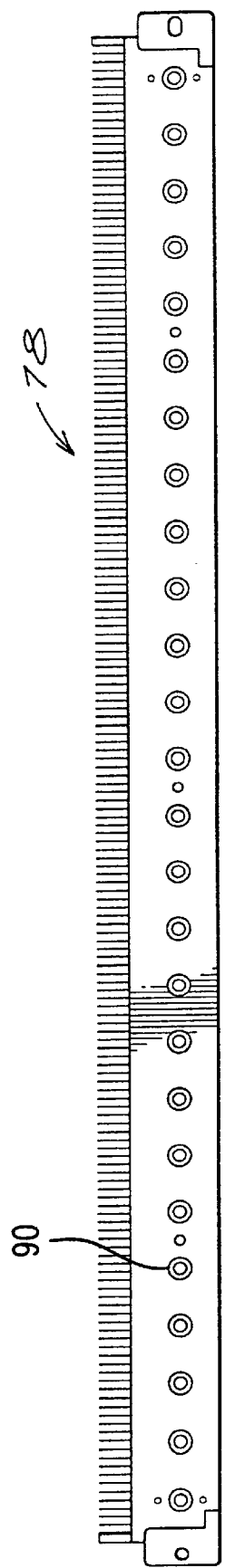
FIGS. 9A–C show views of a preferred anode support bar.
Figure 9B:
Figure 9C:
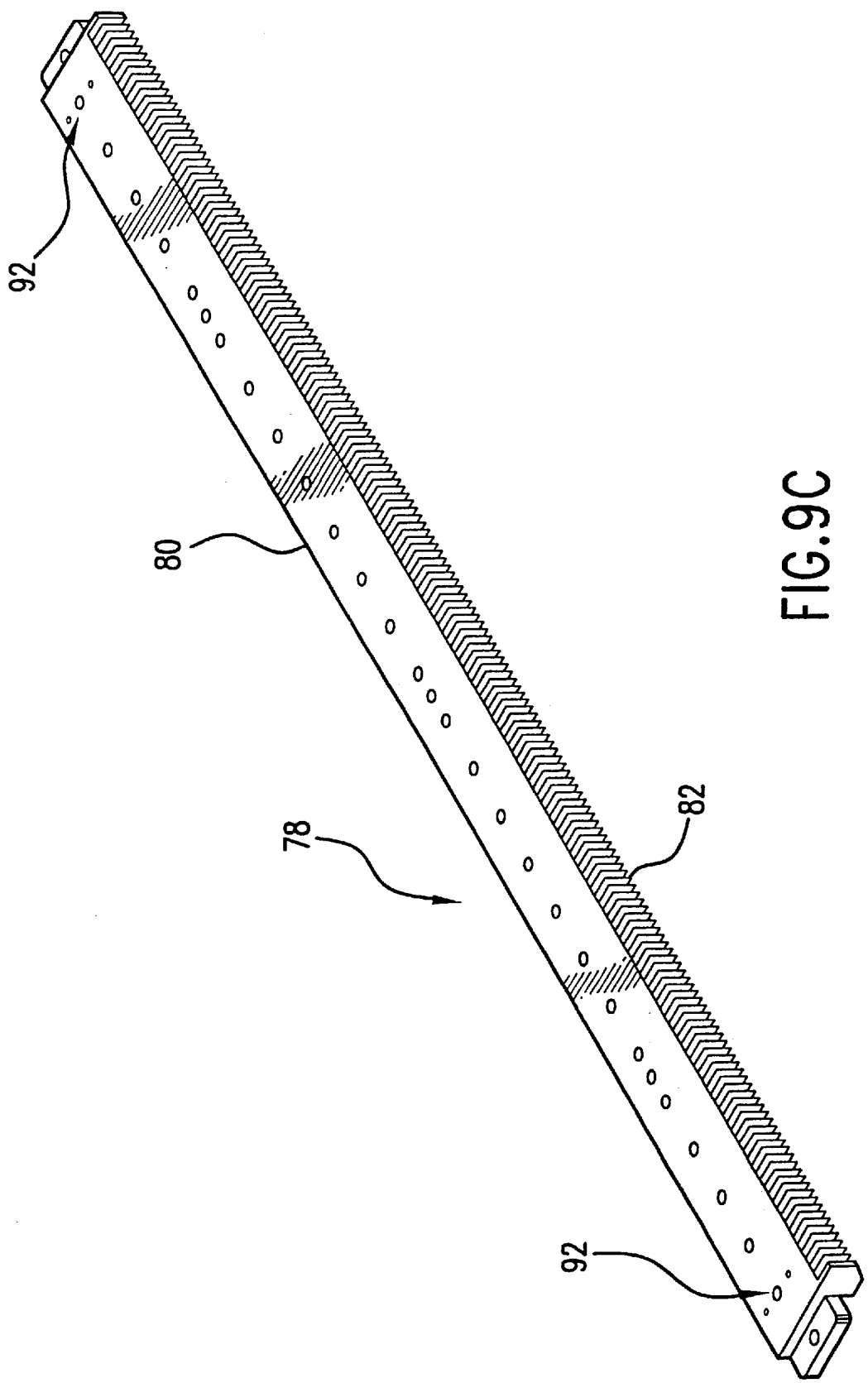

Anode support bar 78 is shown in FIGS. 9A, 9B and 9C. FIG. 9A is a top view. FIG. 9B is a bottom view. FIG. 9C is a prospective view of anode support bar 78. Holes for screws to attach anode 72 are shown at 90 and holes for fairing dowel pins are shown at 92. FIGS. 9A and 9C each show three small regularly spaced close tolerance holes for dowel pins for precisely positioning the anode on the anode support bar. Corresponding regularly spaced dowel pin holes are provided in the bottom of the anode but these holes are not shown in FIGS. 7B and C.

Cathode

Figure 10A:
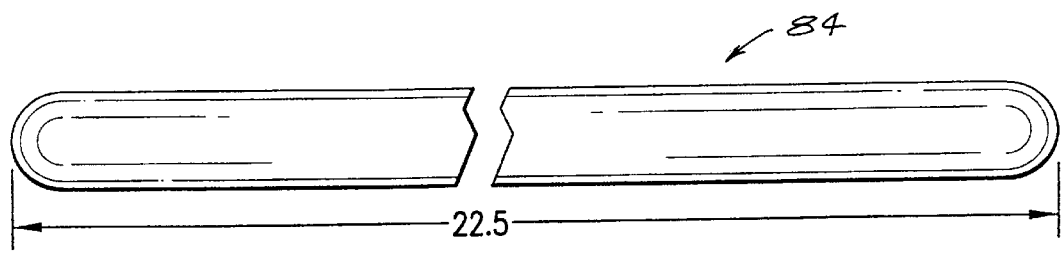
FIGS. 10A–E show views of a preferred cathode.
Figure 10B:
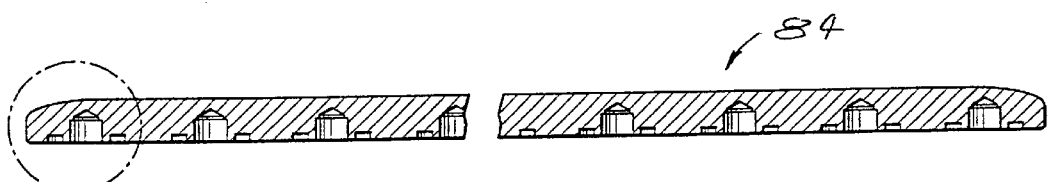
Figure 10C:
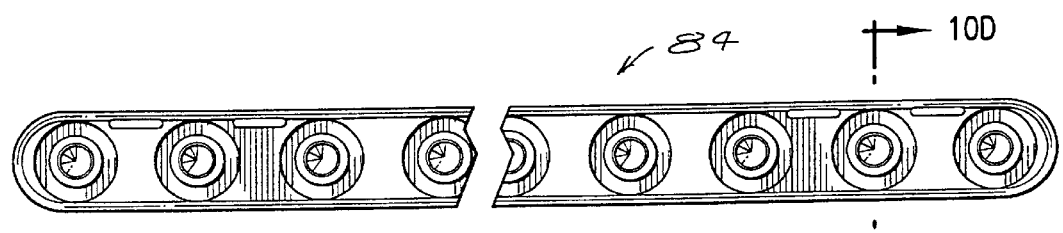
Figure 10D:
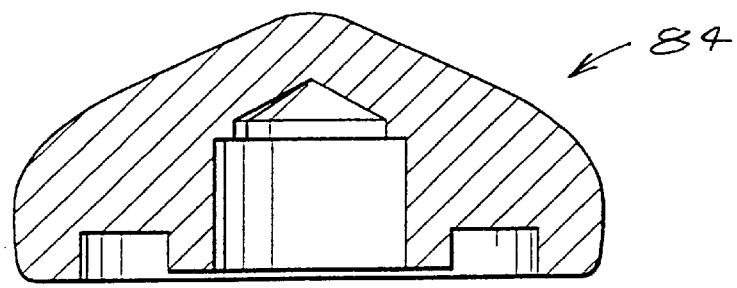
Figure 10E:
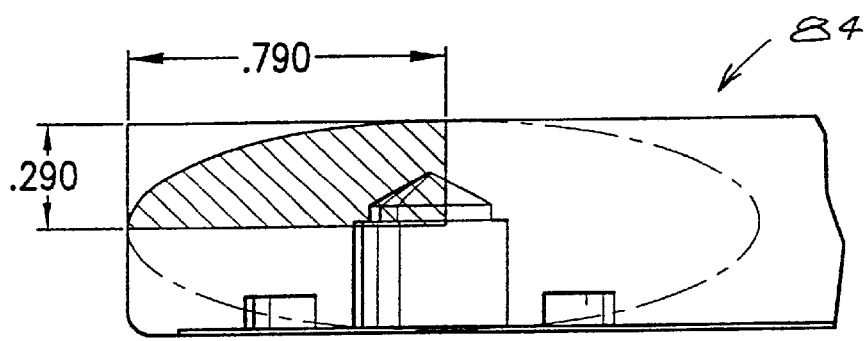
Figure 10F:
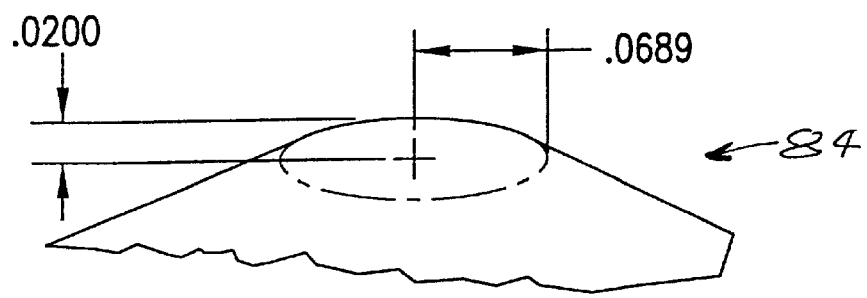

Cathode 84 is described in FIGS. 10A, 10B, 10C, 10D, 10E and 10F. FIG. 10A is a top view. FIG. 10B is a longitudinal cross section side view. FIG. 10C is a bottom view. FIG. 10D is a cross section at the cathode short dimension. FIG. 10E shows the surface shape at each end of the cathode. FIG. 10F shows the point of the cathode which faces the anode.

Figure 1:
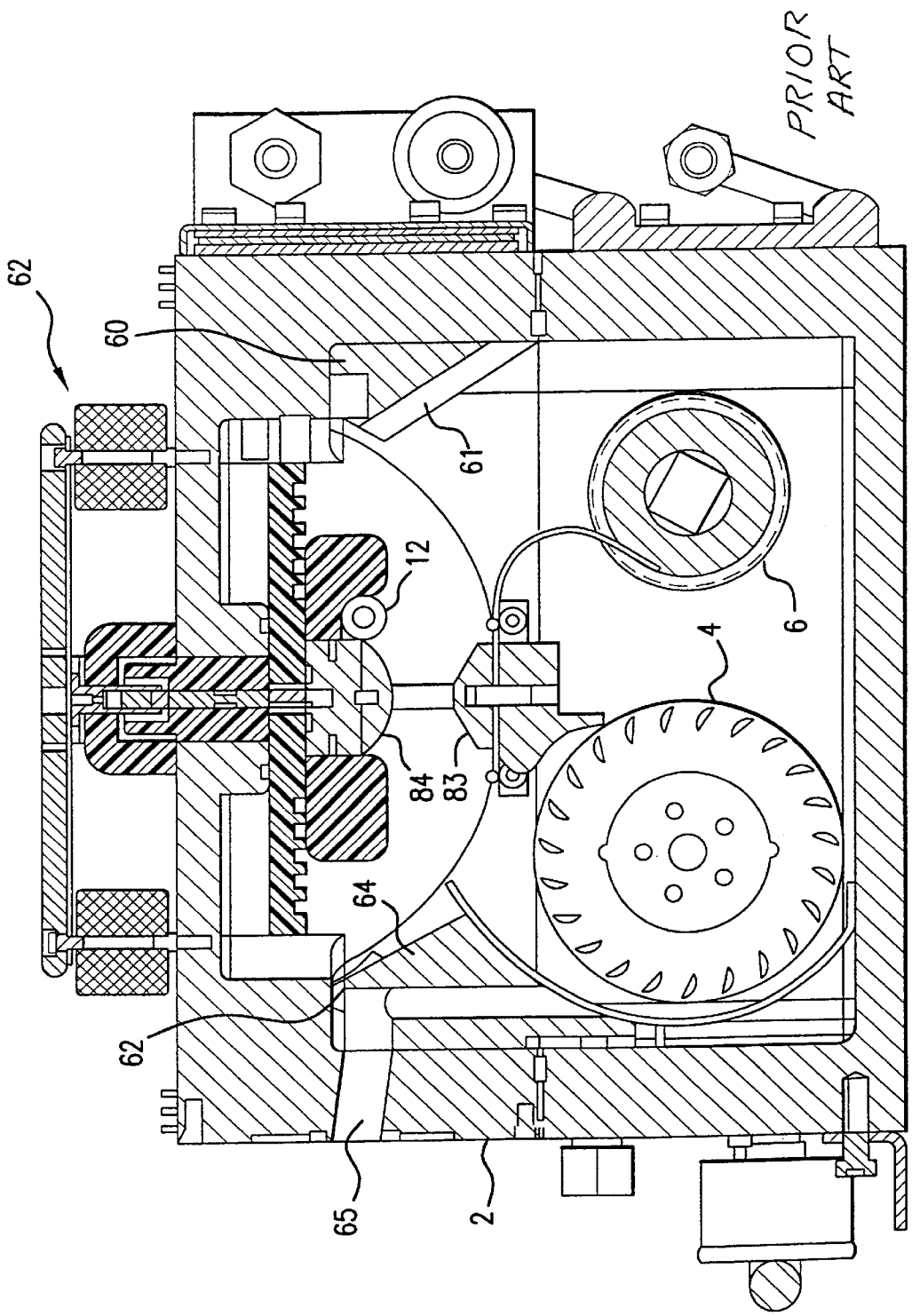
FIG. 1 shows a cross section of a chamber of a prior-art gas discharge laser.
Figure 2:
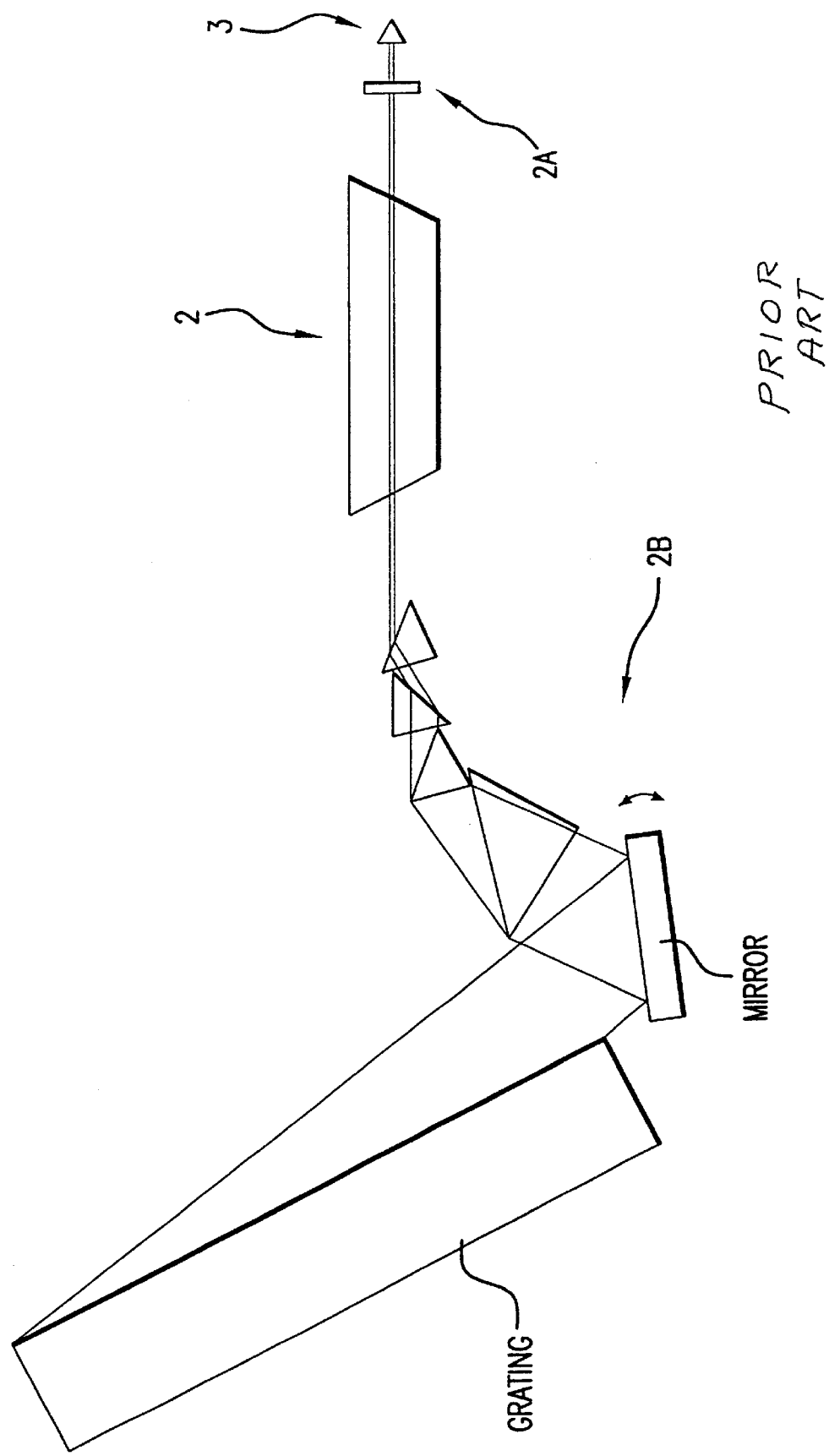
FIG. 2 shows other features of the prior art laser.

There are two important differences between this cathode design and prior art designs as shown in FIG. 1. First, the short cross section shape of the cathode is generally pointed shape giving the cathode its descriptive name, i.e., "pointed cathode". The surface of the cathode facing the anode are flat surfaces 94 approaching each other at an angle of 130 degrees. A 0.116 inch portion at the actual mid-point is rounded off with an elliptical shape as shown in FIG. 10F. In this embodiment, there are 15 equally spaced threaded holes for holding the cathode against a main insulator shown as 85 in FIG. 6 and connecting the cathode electrically to the high voltage pulse power of the laser system. The second difference is that the end sections of the cathode taper down along an elliptical path as shown in FIG. 10E. This shape substantially improves the electric field distribution as compared to prior art electrodes with end sections that are rounded off.

Current Return

Figure 11A:
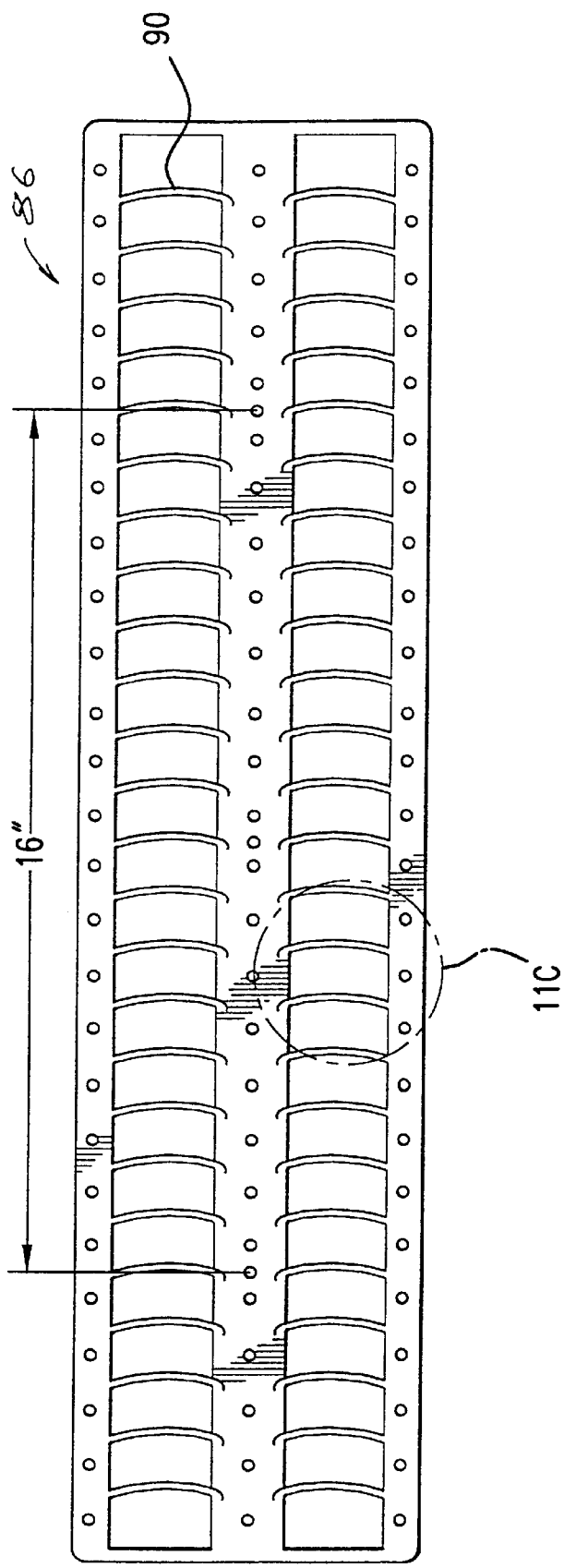
FIGS. 11A–D show views of a first preferred current return.
Figure 11B:
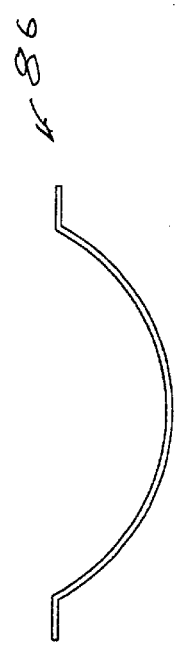
Figure 11C:
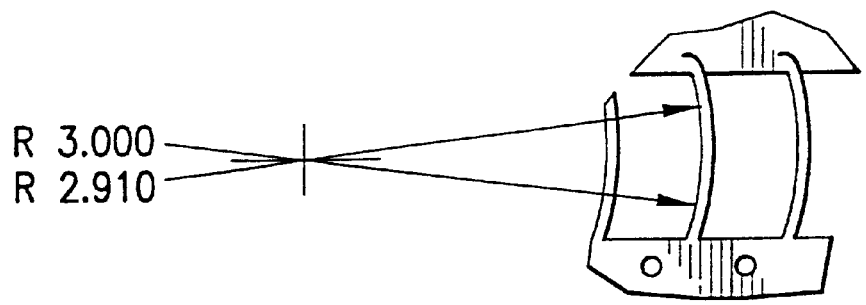
Figure 11D:
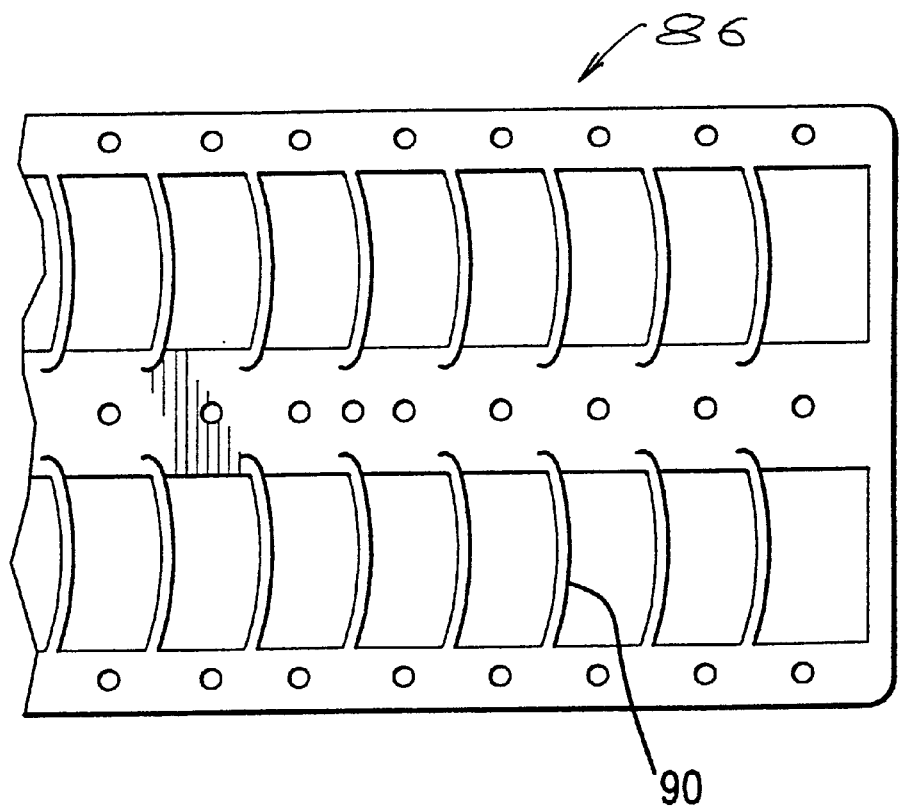
Figure 12A:
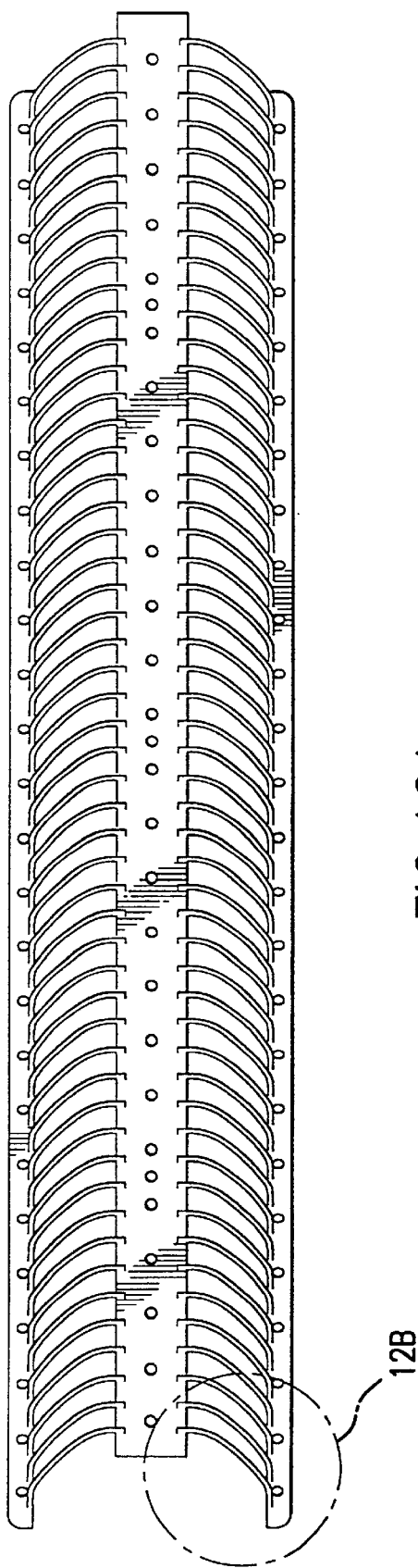
FIGS. 12A–F show views of a second preferred current return.
Figure 12B:
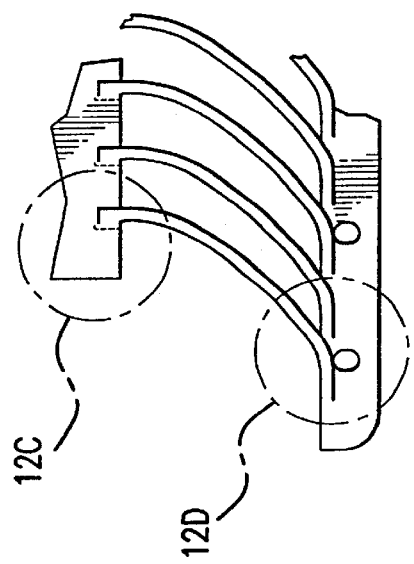
Figure 12C:
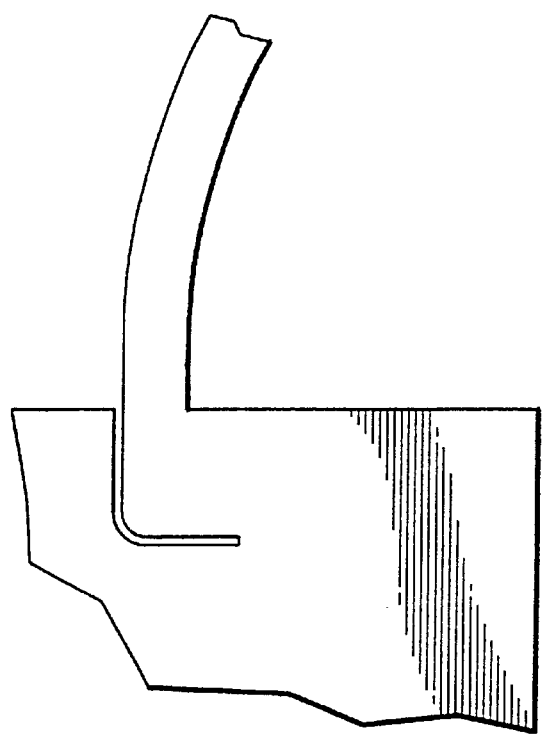
Figure 12D:
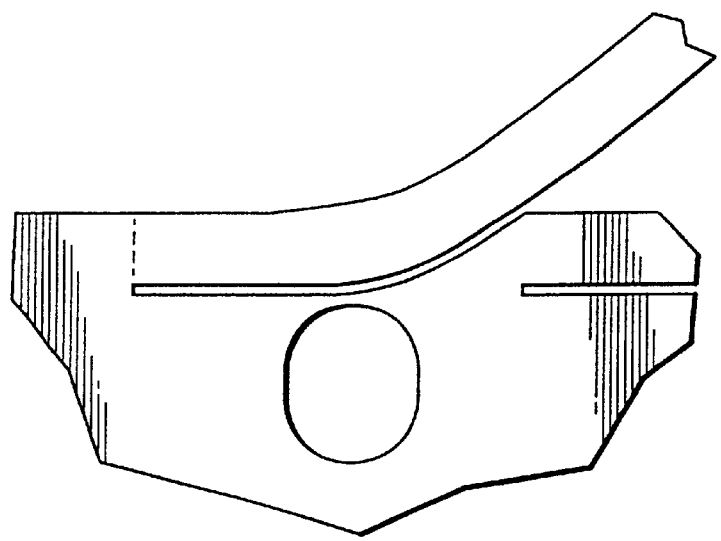
Figure 12E:
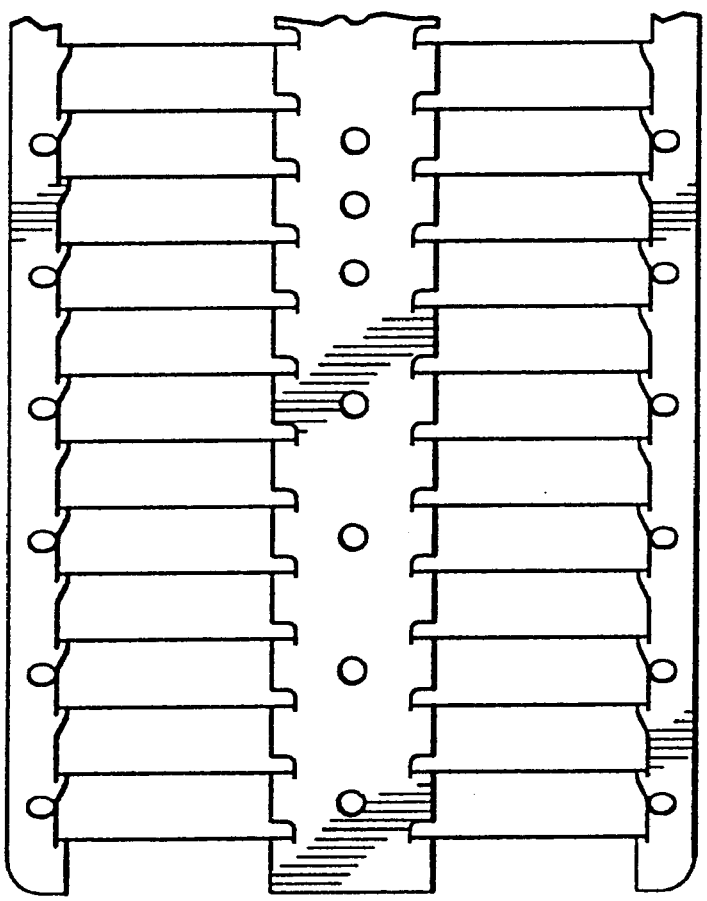
Figure 12F:
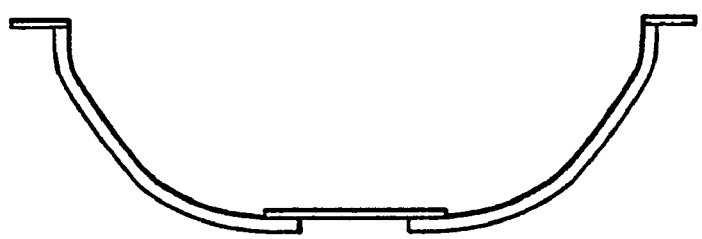

Details of current return 86 are shown in FIGS. 11A, 11B, 11C and 11D. FIG. 11A shows how the current return is cut or stamped from a 0.015 inch thick nickel alloy 400 (UNS ND4400) sheet. The current return is formed into the shape shown at FIG. 11B. Ribs 90 are 0.09 inch wide as shown in FIG. 11C and 0.015 inch thick are bent so that the 0.09 inch dimension is parallel to the gas flow to minimize flow resistance. FIG. 11D is an enlarged view of one end of the current return showing how the ribs are cut to facilitate the bending referred to above. A second current return design is shown in FIGS. 12A–F. This design is laser cut from the same material referred to above as shown in FIG. 12A. FIG. 12B is an enlargement of the 12B section shown in FIG. 12A. FIGS. 12C and 12D are further enlargements of the sections shown in FIG. 12B. FIG. 12E is a bottom view of the current return after the ribs have been bent into shape. FIG. 12F is a side view looking in the discharge direction.

Other Blade Shapes

Figure 13A:
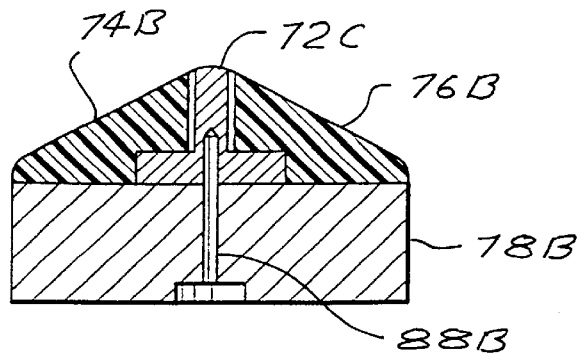
FIGS. 13A–C show additional blade electrodes.
Figure 13B:
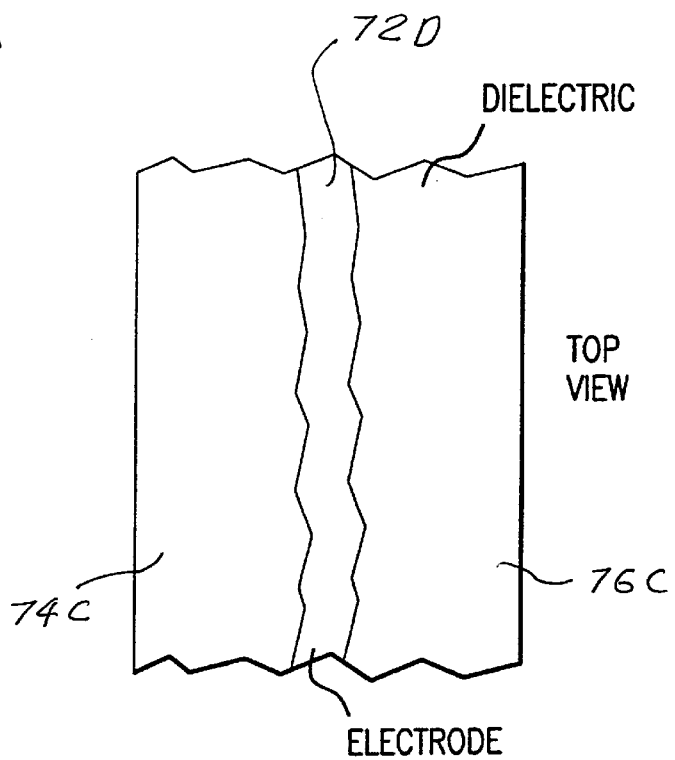
Figure 13C:
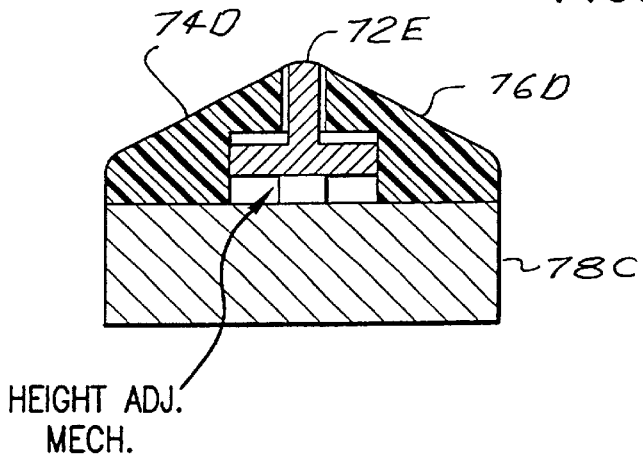

Many other blade shape designs are possible within the general scope of this invention. FIG. 13A shows a blade design with vertical sides. The sides could be flat or the sides could include a pattern such as shown in FIG. 13B where the sides are vertical but are provided with a periodic modulation with a amplitude of about 0.3 mm repeating at about 1.5 cm spacings. The anode as shown in FIG. 13C could include a height adjusting mechanism to accommodate erosion at the surface of the electrode. The adjusting mechanism could be any of a variety of mechanisms such as cams, rack and pinion, incline plane or lever arms. The adjustment could be manual in which case the adjustment would be made at periodic maintenance downtimes or the adjustments could be motorized. The adjustment mechanism could be made very fast by incorporating piezoelectric drivers in which case adjustment could be made on a real time basis and used for tuning the laser.

While the invention has been described above with specificity in terms of preferred embodiments, the reader should understand and recognize that many changes and alterations could be made without deviating from the spirit of the invention. For example, the downstream fairing may be shaped to define a gradually expanding diffuser region permitting gas pressure recovery and avoiding substantial turbulence downstream of the discharge region. Preferably, the diffusion region should expand at the rate of about 7 to 15 degrees. The fairings may be made of or coated with a metal fluoride insulating layer. The anode could be configured so that its vertical position could be adjusted relative to the anode support bar so as to accommodate erosion at the anode surface or to fine tune the laser output. The principals of this invention could be applied to many other gas discharge lasers other than KrF lasers such as, for example, ArF lasers, $F_2$ laser. Therefore, the scope of the invention should be determined by the appended claims and their legal equivalents.

We claim:

1. A gas discharge laser comprising:
   A) a laser chamber containing a laser gas,
   B) two elongated erodable electrode elements disposed within said laser chamber, at least one of said electrode elements having a blunt blade-shaped portion comprised of a material with high electric conductivity and a first flow-shaping dielectric fairing positioned on a first side of said blade-shaped portion and a second flow-shaping dielectric fairing positioned on a second side of said blade-shaped portion,
   c) a pulse power system providing electrical pulses to said electrodes at rates in excess of 1,000 Hz to produce electric discharges, each discharge defining a discharge region and a discharge shape,
   D) a blower system for circulating said laser gas between said two electrodes at a velocity in excess of 5 m per second,
   E) a heat exchanger having sufficient capacity to remove heat from said laser gas produced by said blower system and said discharge,
   F) a gas flow guiding means to guide gas flow past said erodable electrodes without creating significant turbulence in said gas either when the electrodes are new or when the electrodes are eroded to their end-of-life shape.

2. A laser as in claim 1, wherein at least one of said first or second fairings is a flow shaper at least partially defining a gradually expanding diffuser region permitting gas pressure recovery and avoiding substantial flow turbulence downstream of said discharge region.

3. A laser as in claim 2 wherein said gradually expanding diffuser region defines a cone angle of about 7 to 15 degrees.

4. A laser as in claim 1 wherein said dielectric fairings are comprised of a metal fluoride.

5. A laser as in claim 1 wherein said dielectric fairings are comprised of alumina.

6. A laser as in claim 1 wherein said dielectric fairings comprise an insulating edge comprised of a metal fluoride.

7. A laser as in claim 1 wherein at least one of an erodable electrode elements is position adjustable relative to said electrode support.

8. A laser as in claim 1 wherein said blunt blade-shaped portion is comprised of a copper alloy.

9. A laser as in claim 8 wherein said copper alloy comprises copper, aluminum and iron.

10. A laser as in claim 8 wherein said copper alloy is comprised of about 97.5 percent copper 2.35 percent iron and 0.12 percent zinc.

11. A laser as in claim 8 wherein said copper alloy is comprised of about 85 percent copper, 11 percent aluminum and 4 percent iron.

12. A laser as in claim 8 wherein said blunt blade-shaped portion is produced by a machining process and is annealed after machining.

13. A laser as in claim 8 wherein said copper alloy is a spinodal copper alloy.

14. A laser as in claim 1 wherein one of said electrode elements is a cathode having a generally pointed-shaped cross section.

15. A laser as in claim 14 wherein said cathode comprises two surfaces approaching each other at an angle of about 130 degrees.

16. A laser as in claim 1 wherein one of said electrode elements is a cathode having two tapered end sections tapered to provide uniform electric fields along said end sections.

17. A laser as in claim 16 wherein each of said tapered end sections taper along a path approximating a portion of an ellipse.

* * * * *